United States Patent [19]
Park et al.

[11] Patent Number: 5,896,323
[45] Date of Patent: Apr. 20, 1999

[54] DATA OUTPUT CONTROL CIRCUIT FOR SEMICONDUCTOR MEMORY DEVICE

[75] Inventors: Yi Hwan Park, Choongcheongbuk-Do; Hyun Soo Shin, Choongcheongnam-Do, both of Rep. of Korea

[73] Assignee: LG Semicon Co., Ltd., Cheongju, Rep. of Korea

[21] Appl. No.: 08/900,340

[22] Filed: Jul. 25, 1997

[30] Foreign Application Priority Data

Jul. 26, 1996 [KR] Rep. of Korea ............ 96/30586

[51] Int. Cl.$^6$ ............................................. G11C 16/04
[52] U.S. Cl. ............................ 365/189.05; 365/233.5; 365/191
[58] Field of Search .................... 365/233.5, 189.05, 365/194, 189.08, 191, 185.17

[56] References Cited

U.S. PATENT DOCUMENTS 5,648,932  7/1997  Kang ........................ 365/194
5,694,361  12/1997 Uchida ...................... 365/189.05
5,715,212  2/1998  Tanida et al. .............. 365/233.5

*Primary Examiner*—David Nelms
*Assistant Examiner*—Thong Le
*Attorney, Agent, or Firm*—Fleshner & Kim

[57] ABSTRACT

A data output control circuit for a semiconductor memory device sequentially transmits input data via a main amplifier controlled by an address transition detecting signal, a multiplex/latch unit, a data output buffer and an output operator. The data output control circuit prevents false data output, which also improves data processing speed by using a control signal. The data output control circuit includes an output control unit that converts an address transition detecting signal into a kill signal. The kill signal is applied to the data output buffer to cause the output operator to generate a zero level signal based on the address transition detecting signal. The data output control circuit enables the output operator to generate a zero level signal by applying the kill signal to the data output buffer when the transition of an address signal is detected. Accordingly, an interval for a data reversal or a full swing is prevented to enhance data processing speed and reduce current consumption.

19 Claims, 4 Drawing Sheets

ATD

DATA/$\overline{DATA}$

OUT/$\overline{OUT}$

D/$\overline{D}$

SEL

DQ   Hiz

ADD

ATD

DATA/$\overline{\text{DATA}}$

OUT/$\overline{\text{OUT}}$

D/$\overline{\text{D}}$

SEL

KILL

DQ    Hiz          "H" DATA         "L" DATA
      REMOVE           REMOVE
      FALSE DATA       FALSE DATA

DATA OUTPUT CONTROL CIRCUIT FOR SEMICONDUCTOR MEMORY DEVICE

BACKGROUND OF THE INVENTION

1. Field of the Invention

The present invention is related to preventing false data output when reading data stored in a semiconductor memory device, and more particularly, to a data output control circuit for the semiconductor memory device that prevents a false data output based on an address transition detecting signal to improve data processing speed.

2. Background of the Related Art

As shown in FIG. 1, a data output control circuit of a related art memory device includes a main amplifier 1, a multiplex/latch unit 2, a data output buffer, an output operator 3A and a delay unit 4. The main amplifier 1 amplifies data DATA, DATA' received from the memory device in accordance with an address transition detecting signal ATD. As shown in FIGS. 1 and 3B, the data DATA' is $\overline{DATA}$. The multiplex/latch unit 2 multiplexes and latches in the output from the main amplifier 1. The data output buffer 3 externally outputs data D, D' latched in the multiplex/latch unit 2 in accordance with a select signal SEL. As shown in FIGS. 2 and 3D, the data D' is equal to $\overline{D}$. The output operator 3A amplifies to a predetermined level the output from the data output buffer 3 for interfacing with an external circuit (not shown). The delay unit 4 delays the address transition detecting signal ATD for a preset time and outputs the select signal SEL.

With reference to FIGS. 2 and 3A–3F, the operation of the related art data output control circuit will now be described.

First, a high level address transition detecting signal ATD is applied to operate the main amplifier 1. The data DATA, DATA' from the memory device is amplified to a certain level, and then multiplexed and latched in the multiplex/latch unit 2. The address transition detecting signal ATD turns into the select signal SEL via the delay unit 4. As shown in FIG. 3E, the select signal SEL is applied to the data output buffer 3 to control the output of the data D, D' latched in the multiplex/latch unit 2.

The transition of an address signal causes the address transition detecting signal ATD to assume a low level as shown in FIG. 3A. Accordingly, the main amplifier 1 stops operating, which blocks the input of the data DATA, DATA' and the output of the data OUT, OUT' as shown in FIGS. 3B–3C.

When the select signal SEL is applied to the data output buffer 3 via the delay unit 4, a previous cycle's data stored in the multiplex/latch unit 2 or a random data is output via the data output buffer 3 and the output operator 3A to an external circuit as shown in FIG. 3F, thereby resulting in a false data output.

Thus, the related art data output circuit disadvantageously retards the data processing speed because of the output of undesired false data, and accordingly electric current is wasted.

In addition, although the address transition detecting signal ATD restrains a false data output by controlling the output timing of the select signal SEL applied to the output buffer, the false data can be externally transmitted by the data output control circuit at certain timing points because of the difficulty in controlling the output timing.

The above references are incorporated by reference herein where appropriate for appropriate teachings of additional or alternative details, features and/or technical background.

SUMMARY OF THE INVENTION

An object of the present invention is to substantially obviate one or more of the problems caused by limitations and disadvantages of the related art.

It is another object of the present invention to prevent a false data output.

It is yet another object of the present invention to improve the processing speed.

It is still another object of the present invention to reduce electric current requirements of a data output control circuit.

It is still yet another object of the present invention to provide a data output control circuit for a semiconductor memory device that controls the operation of a data output buffer when detecting an address signal using an address transition detecting signal instead of a select signal data output buffer.

To achieve at least the above objects, there is provided a data output control circuit according to the present invention wherein an input data is sequentially output via a main amplifier controlled by an address transition detecting signal, a multiplex/latch unit, a data output buffer and an output operator. The data output control circuit includes an output control device that converts the address transition detecting signal into a signal that is input to the data output buffer to cause the output operator to generate a zero level signal when enabling the address transition detecting signal.

The present invention may be achieved in part or in whole by a data output control circuit for use in a semiconductor memory device, wherein input data is transmitted sequentially via a main amplifier controlled by an address transition detecting signal, a multiplex/latch unit, a data output buffer and an output operation device, the data output control circuit including an output control device for converting the address transition detecting signal into a control signal, wherein the control signal is applied to the data output buffer to cause the output operation device to generate a prescribed level signal when the address transition detecting signal is enabled.

The present invention can also be achieved in part or in whole by a data output control circuit for a semiconductor memory device, including a main amplifier that amplifies input data, wherein the data is input based on an address transition detecting signal; a multiplex/latch unit that latches the amplified data received from the main amplifier; a data output buffer that receives the latched data, a select signal and a control signal and outputs first and second signals; an output device that receives the first and second signals from the data output buffer; an output control device that determines the control signal based on the address transition detecting signal, wherein the control signal prevents false data output from the output device when the address transition detecting signal is enabled.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
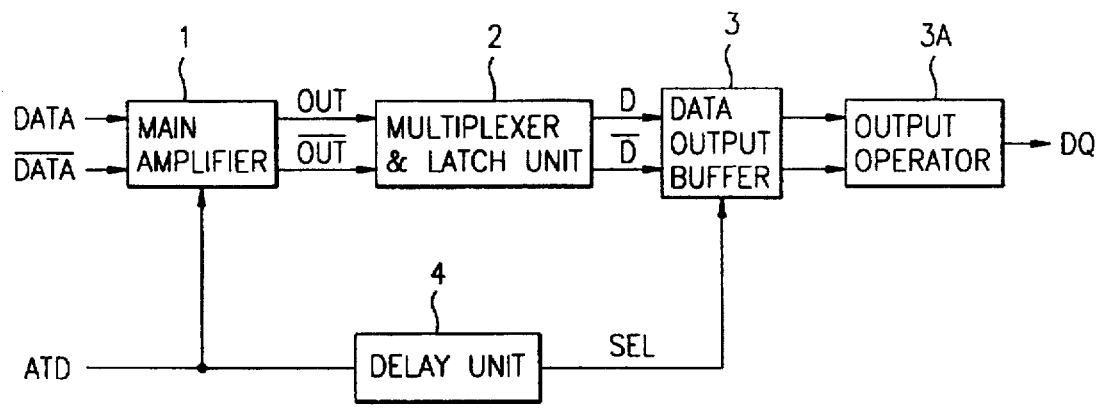
FIG. 1 is a schematic block diagram showing a related art data output control circuit of a semiconductor memory device.
Figure 2:
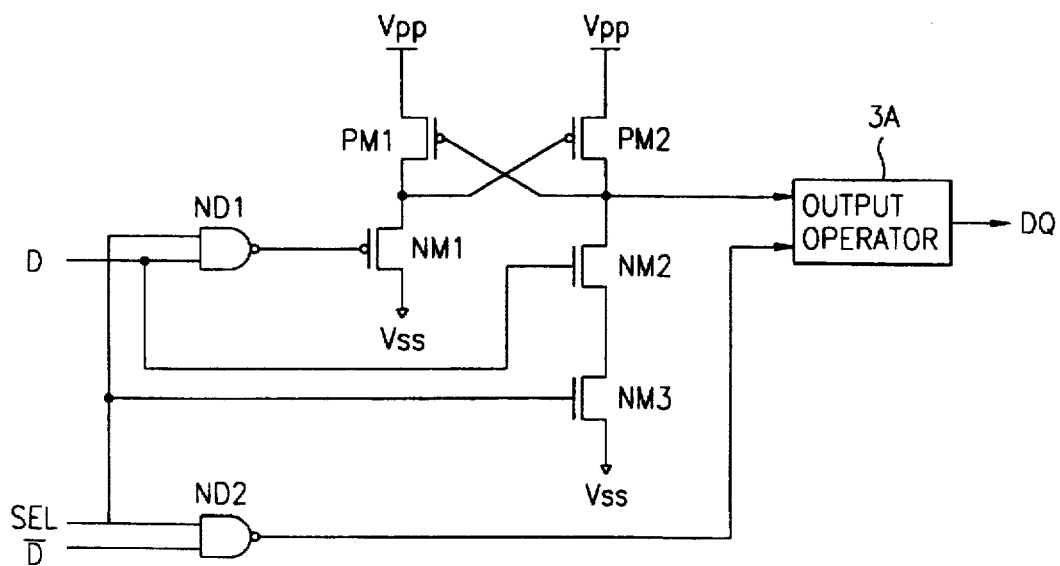
FIG. 2 is a schematic block diagram showing a data output buffer in the circuit of FIG. 1.
Figures 3A, 3B, 3C, 3D, 3E, 3F:
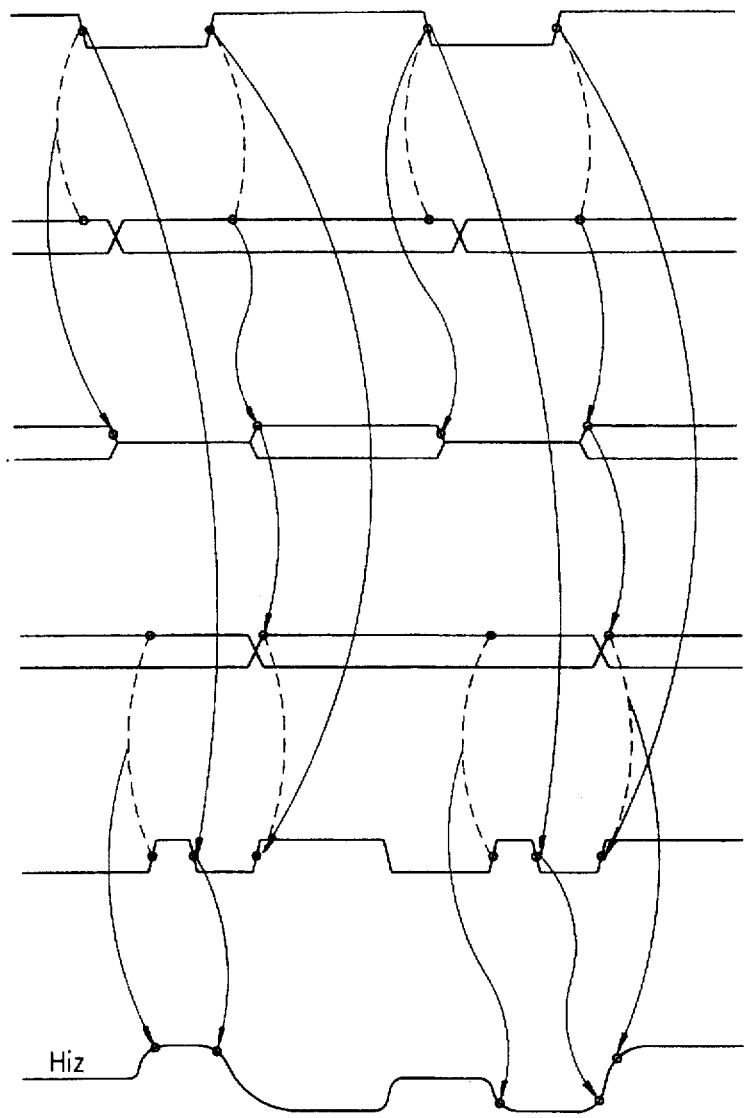
FIGS. 3A–3F are diagrams showing timing waveforms of the circuit of FIG. 1.
Figure 4:
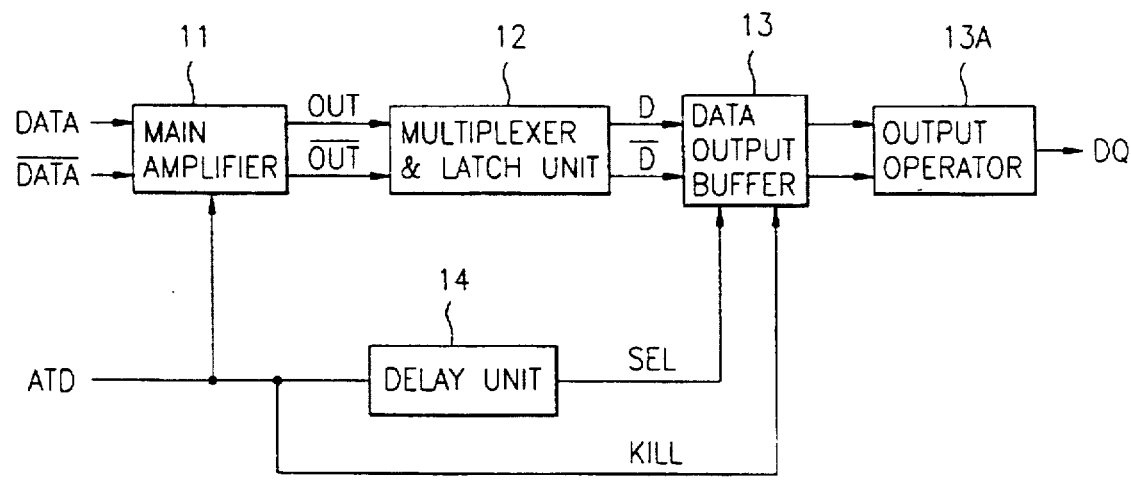
FIG. 4 is a schematic block diagram showing a preferred embodiment of a data output control circuit according to the present invention.

A first preferred embodiment of a data output control circuit of a semiconductor memory device according to the present invention is shown in FIG. 4. The data output control circuit includes a main amplifier 11, a multiplex/latch unit 12, a data output buffer 13 an output operator 13A, a delay unit 14 and an output controller.

Figure 5:
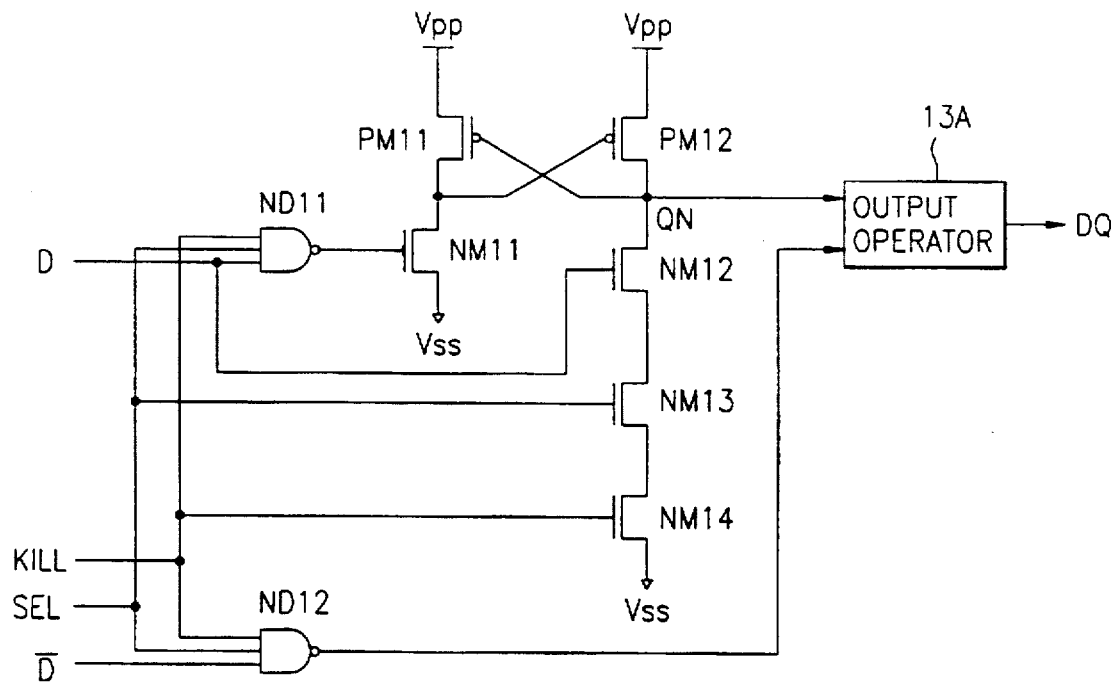
FIG. 5 is a schematic block diagram showing a data output buffer of the circuit of FIG. 4.

The main amplifier 11 amplifies to a first predetermined level data DATA, DATA', which are read from a memory device based on an address transition detecting signal ATD. As shown in FIGS. 4 and 6C, the DATA' is preferably $\overline{\text{DATA}}$. The multiplex/latch unit 12 multiplies and latches the data output from the main amplifier 11. The data output buffer 13 externally outputs data D, D' latched in the multiplex/latch unit 12 based on a select signal SEL. As shown in FIGS. 4, 5 and 6E, the data D' is preferably $\overline{\text{D}}$. The output operator 13A amplifies to a second predetermined level the output from the data output buffer 13, which can be transmitted to an external circuit (not shown). The delay unit 14 delays the address transition detecting signal ATD for a predetermined time and outputs the select signal SEL.

The output controller controls the data output buffer to prevent false data output during an interval for enabling the address transition detecting signal ATD. The output controller generates a control signal that removes false data from the output operator signal DQ. Preferably, the output controller converts the address transition detecting signal ATD into a kill signal KILL, which is directly applied to the data output buffer 13. The kill signal KILL causes the output operator 13A to generate a zero level signal Hiz during an interval that enables the address transition detecting signal ATD.

With reference to FIGS. 5 and 6A–6H, operations of the preferred embodiment of the data output control circuit will now be described.

The normal data output steps for the data DATA, DATA' from the semiconductor memory device are similar to the above-described related art. That is, a high level address transition detecting signal ATD is applied to operate the main amplifier 11. The data DATA, DATA' from the memory device is amplified to the first predetermined level, and then multiplexed and latched in the multiplex/latch unit 12. The address transition detecting signal ATD is converted to a select signal SEL using the delay unit 14. The select signal SEL is applied to the data output buffer 13 to control the output of the data D, D' latched in the multiplex/latch unit 12.

Figure 6A:
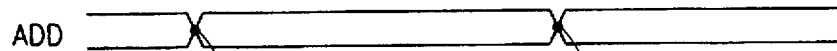
FIGS. 6A–6H are diagrams showing timing waveforms of the circuit of FIG. 4.
Figure 6B:
Figure 6C:
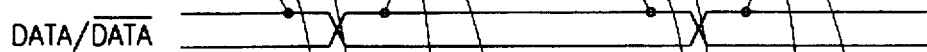
Figure 6D:
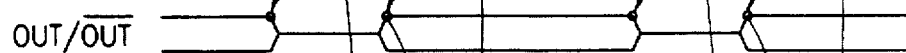
Figure 6E:
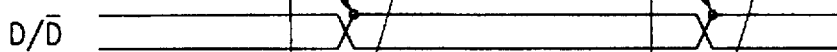
Figure 6F:

The transition of an address signal ADD shown in FIG. 6A transitions the address transition detecting signal ATD to a low level as shown in FIG. 6B. Accordingly, the main amplifier 11 stops operating, which blocks the input of the DATA, DATA' as shown in FIG. 6C and the output of the data OUT, OUT' as shown in FIG. 6D.

A kill signal KILL prevents a false data output from the data output buffer 13. When the address transition detecting signal ATD becomes a low level as shown in FIG. 6B, the select signal SEL is applied through the delay unit 14 to the data output buffer 13 as shown at 'A' in FIG. 6F. Thus, the previous cycle's data latched in the multiplex/latch unit 12, or a random data is applied to the data output buffer 13.

Figure 6G:
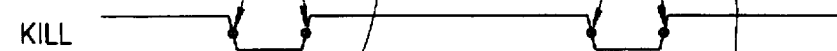
Figure 6H:
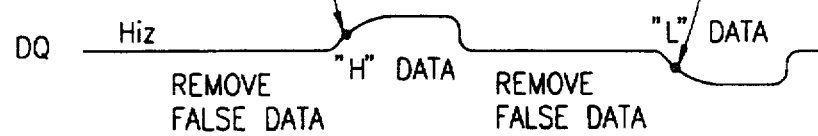

However, the address transition detecting signal ATD is converted into the kill signal KILL, which is further applied to the data output buffer 13. Thus, the operation of the data output buffer 13 remains blocked during a low level of the kill signal KILL as shown in FIG. 6G. Thus, the output operator 13A generates the zero level signal Hiz as shown in FIG. 6H, which prevents a false data output.

When the address transition detecting signal ATD transits again to a high level, the kill signal KILL is also transited to a high level and disabled. During this period, the data output buffer 13 resumes operations. As a result, the data D, D' applied to the data output buffer 13 from the multiplex/latch unit 12 is processed.

Referring to FIG. 5, operations of the data output buffer 13 and the output operator 13A will now be described.

When the kill signal KILL and the select signal SEL are at a high level, and the input data D, D' applied to the data output buffer 13 is set at low and a high levels, respectively, a NAND gate ND11 outputs a high signal based on the input data D. Thus, an NMOS transistor NM11 is turned on, whereby a low level signal is applied to the gate of a PMOS transistor PM12. As a result, the PMOS transistor PM12 is turned on. The PMOS transistor PM12 is serially coupled between the NMOS transistor NM11 and a supply potential Vpp. Also, because the low input data D turns off an NMOS transistor NM12, a high level signal is output from a common node QN coupled to the drains of the PMOS transistor PM12 and the NMOS transistor NM12 to a first input of the output operator 13A. The NMOS transistor NM12 is coupled to ground Vss through serially coupled NMOS transistors NM13 and NM14, respectively. Further, the kill signal KILL is applied to the gate of the NMOS transistor NM14 and the select signal SEL is applied to the gate of the NMOS transistor NM13.

A NAND gate ND12 receives the kill signal KILL, the select signal SEL and the data D' as inputs. At this time, a high level signal is applied to the three inputs of the NAND gate ND12. Thus, a low level signal is output to a second input of the output operator 13A from the NAND gate ND12. Consequently, a high level signal and a low level signal are respectively sequentially applied to the first and second inputs of the output operator 13A, which in turn generates a low level output signal DQ. The output signal DQ is shown in FIG. 6H.

However, when the kill signal KILL and the select signal SEL are a high level and a high level input data D and a low level input data D' are applied to the data output buffer 13, a high level signal is transmitted to the three inputs of the NAND gate ND11. The NAND gate ND11 generates a low level signal to turn off the NMOS transistor NM11 and the PMOS transistor PM12. At this time, based on the high level input data D, the select signal SEL and the kill signal KILL, the NMOS transistors NM12–NM14 serially coupled to the PMOS transistor PM12 are turned on. Thus, a low level signal is applied via the common drain node QN to the first input terminal of the output operator 13A.

Based on the low input data D', the NAND gate ND12 generates a high level signal that is applied to the second input terminal of the output operator 13A. Consequently, a low level signal and a high level signal are respectively applied to the first and second input terminals of the output generator 13A to generate a high level output data signal DQ.

Further, when the address transition detecting signal ATD and the kill signal KILL are set at a low level, the NAND gates ND11, ND12 generate high level signals. The high level signals from the NAND gates ND11, ND12 are respectively applied to the input terminals of the output operator 13A. As shown in FIG. 6H, the output operator 13A then generates the zero level signal Hiz as the output signal DQ.

The first preferred embodiment of the data output control circuit enables an output operator to generate a zero level signal based on the kill signal applied to the data output buffer when detecting the transition of an address signal. Accordingly, an interval for a data reversal (or a full swing) does not occur, thereby enhancing the data processing speed and reducing the current consumption.

It is to be understood that both the foregoing general description and the following detailed description are exemplary and explanatory. It will be apparent to those skilled in the art that various modifications can be made in the data output control circuit and method of the present invention without departing from the spirit or scope of the invention. It is intended that the present invention cover the modifications and variations of this invention that are within the scope of the appended claims and their equivalents.

What is claimed is:

1. A data output control circuit for use in a semiconductor memory device, wherein input data is transmitted sequentially via a main amplifier controlled by an address transition detecting signal, a multiplex/latch unit, a data output buffer and an output operation device, the data output buffer comprising:

an output control circuit that combines the address transition detecting signal, a control signal, and the input data to output first and second signals, wherein the output control circuit comprises, a first logic circuit that receives a first of the two input data, the address transition detecting signal and the control signal to output an intermediate control signal, a second logic circuit that receives the second of the two input data, the address transition detecting signal and the control signal to output the second signal, a high signal output circuit that receives the intermediate control signal to output a high level first signal, and a low signal output circuit that receives the second input data, the address transition detecting signal and the control signal to output a low level first signal.

2. The data output control circuit of claim 1, wherein the output control circuit prevents false data output during an interval for enabling the address transition detecting signal.

3. The data output control circuit of claim 1, wherein the output control circuit removes false data from a signal output by the output operation device.

4. The data output control circuit of claim 1, wherein the data output buffer prevents an interval for data reversal to improve data processing speed.

5. The data output control circuit of claim 1, wherein the address transition detecting signal is based on an address signal.

6. The data output control circuit of claim 1, wherein the control signal is a select signal based on the address transition detecting signal.

7. The data output control circuit as recited in claim 6, further comprising:

a first NAND gate that receives the first input data, the address transition detecting signal and the select signal;

a second NAND gate that receives the second input data, the address transition detecting signal and the select signal;

first and second PMOS transistors having respective sources coupled to a supply potential, and wherein a gate of each of the first and second PMOS transistors is coupled to a corresponding drain of the other;

a first NMOS transistor having a source coupled to ground, a gate coupled to an output of the first NAND gate and a drain coupled to the drain of the first PMOS transistor;

second, third and fourth NMOS transistors serially coupled to each other between the drain of the second PMOS transistor and the ground, wherein the first input data, the select signal and the address transition detecting signal are respectively applied to gates of the second, third and fourth NMOS transistors;

a node coupling the drain of the second PMOS transistor, a gate of the second NMOS transistor and a first input of the output operation device; and an output from the second NAND gate coupled to a second input of the output operation device.

8. The data output control circuit of claim 7, wherein the second input data is the inverse of the first input data.

9. The data output control circuit as recited in claim 1, further comprising:

a first logic-gate that receives the first input data, the control signal and the address transition detecting signal;

a second logic-gate that receives the second input data, the control signal and the address transition detecting signal;

first and second transistors having respective sources coupled to a supply potential, and wherein a gate of each of the first and second transistors is coupled to a corresponding drain of the other;

a third transistor having a source coupled to ground, a gate coupled to an output of the first logic-gate and a drain coupled to the drain of the first transistor;

fourth, fifth and sixth transistors serially coupled to each other between the drain of the second transistor and the ground, wherein the first input data, the address transition detecting signal and the control signal are respectively applied to gates of the fourth, fifth and sixth transistors;

a node coupling the drain of the second transistor, a gate of the fourth transistor and a first input of the output operation device; and an output from the second logic-gate coupled to a second input of the output operation device.

10. The data output control circuit as recited in claim 9, further comprising:

a first logic gate that receives a first part of an input data, the address transition detecting signal and the select signal;

a second logic gate that receives a second part of the input data, the address transition detecting signal and the select signal;

first and second transistors of a first conductivity type having respective first electrodes coupled to a first potential, and wherein a control electrode of each of the first and second transistors is coupled to a corresponding second electrode of the other;

a first transistor of a second conductivity type having a first electrode coupled to a second potential, a control electrode coupled to an output of the first logic gate and a second electrode coupled to the second electrode of the first transistor of the first conductivity type;

second to fourth transistors of the second conductivity type serially coupled to each other between the second electrode of the second transistor of the first conductivity type and the second potential, wherein the first part of the input data, the select signal and the kill signal are respectively applied to control electrodes of the second to fourth transistors of the second conductivity type;

a node coupling the second electrode of the second transistor of the first conductivity type, a control electrode of the second transistor of the second conductivity type and a first input of the output device; and an output from the second logic gate coupled to a second input of the output device.

11. The data output control circuit as recited in claim 10, wherein first and second logic gates are NAND gates, said first and second transistors of the first conductivity type are PMOS transistors and said first to fourth transistors of the second conductivity type are NMOS transistors, the first, second and control electrodes being source, drain and gate, respectively, and the first and second potentials being source and ground potentials, respectively.

12. The data output control circuit of claim 1, wherein the data output buffer operates in first and second modes, wherein in the first mode of the data output buffer the first and second signals are data signals, wherein in the second mode of the data output buffer, the first and second signals are non-data signals, and wherein the output operation device receives the first and second signals from the data output buffer to output one of two level data in the first mode and a third signal different from each of the two level data in the second mode.

13. A data output control circuit for a semiconductor memory device, comprising:

a main amplifier that receives an address transition detecting signal for outputting data;

a latch unit that latches the data received from the main amplifier;

a data output buffer that combines the latched data from the latch unit, a control signal and the address transition detecting signal to output first and second signals; and an output device that receives the first and second signals from the data output buffer to output one of two level data in a data output state and a third signal different from each of the two level data in a suspended state.

14. The data output control circuit of claim 13, wherein the control signal is a select signal based on the address transition detecting signal.

15. The data output control circuit of claim 13, wherein the data output buffer causes the output device to generate a zero level signal when the address transition detecting signal is enabled.

16. The data output control circuit of claim 13, wherein the data output buffer prevents data reversal.

17. The data output control circuit of claim 13, wherein the data output buffer removes false data from a signal output by the output device.

18. The data output control circuit of claim 13, wherein the input data is for sequential transmission to an external circuit from the output device.

19. A data output control circuit for a semiconductor memory device, comprising:

a main amplifier responsive to an address transition detecting signal to output data;

a latch unit that latches the data received from the main amplifier;

a data output buffer that combines the latched data from the latch unit, a control signal and the address transition detecting signal to output first and second signals, wherein the data output buffer operates in first and second states, wherein in the first state the first and second signals are data signals, and wherein in the second state the first and second signals are non-data signals; and an output device that receives the first and second signals from the data output buffer to output one of the two level data signals and a third signal different from each of the two level data.

* * * * *